United States Patent
Schaaf

(10) Patent No.: US 6,777,936 B2
(45) Date of Patent: Aug. 17, 2004

(54) MAGNETIC RESONANCE APPARATUS WITH A MOVABLE GRADIENT COIL UNIT

(75) Inventor: Michael Schaaf, Oberreichenbach (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 10/158,530

(22) Filed: May 30, 2002

(65) Prior Publication Data

US 2002/0180441 A1 Dec. 5, 2002

(30) Foreign Application Priority Data

May 30, 2001 (DE) ........................................ 101 26 337
Aug. 7, 2001 (DE) ........................................ 101 38 712

(51) Int. Cl.⁷ ................................................ G01V 3/00
(52) U.S. Cl. ................................................... 324/318
(58) Field of Search ............................... 324/318, 322, 324/307–309; 600/410

(56) References Cited

U.S. PATENT DOCUMENTS

| | | | | |
|---|---|---|---|---|
| 4,920,316 A | * | 4/1990 | Egloff ........................ 324/318 |
| 5,185,576 A | | 2/1993 | Vavrek et al. |
| 5,304,933 A | | 4/1994 | Vavrek et al. |
| 5,451,875 A | * | 9/1995 | Patrick et al. ............... 324/318 |
| 5,489,848 A | * | 2/1996 | Furukawa .................... 324/318 |
| 5,585,724 A | * | 12/1996 | Morich et al. ............... 324/318 |
| 5,783,943 A | | 7/1998 | Mastandrea, Jr. et al. |
| 5,952,830 A | * | 9/1999 | Petropoulos et al. ....... 324/318 |
| 6,043,653 A | * | 3/2000 | Takamori et al. ........... 324/309 |
| 6,549,010 B2 | * | 4/2003 | Roozen ....................... 324/318 |
| 6,556,012 B2 | * | 4/2003 | Yamashita .................. 324/318 |
| 6,567,685 B2 | * | 5/2003 | Takamori et al. ........... 600/410 |

FOREIGN PATENT DOCUMENTS

| | | | |
|---|---|---|---|
| EP | 0389911 A2 | * | 3/1990 |
| EP | 0 690 313 | | 1/1996 |
| JP | 102206 A | * | 9/2002 |

* cited by examiner

Primary Examiner—Diego Gutierrez
Assistant Examiner—Dixomara Vargas
(74) Attorney, Agent, or Firm—Schiff Hardin LLP

(57) ABSTRACT

A magnetic resonance apparatus has an examination space for receiving at least one region of an examination subject, a gradient coil unit movable into the examination space in a travel direction, a component of the magnetic resonance apparatus surrounding the examination space and a mount arranged between the examination space and the component with which the gradient coil unit can be supported against the component for fixing in at least one position in the magnetic resonance apparatus, or a mount with which the gradient coil unit can be fixed in at least one position in the magnetic resonance apparatus, with the mount and the gradient coil unit fashioned such that components of the mount are actuatable by a displacement of the gradient coil unit.

28 Claims, 3 Drawing Sheets

MAGNETIC RESONANCE APPARATUS WITH A MOVABLE GRADIENT COIL UNIT

BACKGROUND OF THE INVENTION

1. Field of the Invention

The present invention is directed to a magnetic resonance apparatus.

2. Description of the Prior Art

Magnetic resonance is a known technique for acquiring images of the inside of the body of an examination subject. In a magnetic resonance apparatus, rapidly switched gradient fields that are generated by a gradient system are superimposed on a static basic field that is generated by a basic field magnet. The magnetic resonance apparatus also has a radio-frequency system that radiates radio-frequency signals into the examination subject for triggering magnetic resonance signals and that registers the triggered magnetic resonance signals on the basis of which magnetic resonance images are produced.

The magnetic resonance apparatus has an imaging volume wherein a region of the examination subject to be imaged is positioned for producing magnetic resonance images of that region. To that end, the magnetic resonance apparatus has a support mechanism that is displaceable in at least one direction on which the examination subject can be placed. The positioning of the region to be imaged in the imaging volume is accomplished by suitable displacement of the support mechanism together with the examination subject placed thereon.

For example, U.S. Pat. No. 5,185,576 discloses a gradient coil of the type referred to as a local gradient coil unit that is combined with a local radio-frequency antenna. The local gradient coil unit is fashioned with an integrated, local radio-frequency antenna for a specific region of the examination subject, for example the head of a patient. As a result, the local gradient coil unit can be implemented with smaller dimensions compared to a permanently installed gradient coil system. This achieves advantages with regard to the gradient intensities that can be achieved and the power demands that are made of the gradient amplifier that feeds the gradient coil unit. The local gradient coil unit with the integrated, local radio-frequency antenna is securable on the support mechanism so that the local gradient unit does not move toward the support mechanism, even given operation of the magnetic resonance apparatus and the forces that thereby act on it.

In some embodiments of local gradient coil units, the motion-preventing, secure fastening of the local gradient coil unit in the magnetic resonance apparatus and, conversely, the subsequent removal of the local gradient coil unit, respectively require several hours. In some embodiments, a whole-body antenna of the magnetic resonance apparatus must be installed and then removed in sequence. Among other things, the long equipping times set forth above cause low user friendliness, so that local gradient coil units have been hitherto utilized almost exclusively in research rather than in clinical routines.

SUMMARY OF THE INVENTION

An object of the present invention is to provide a magnetic resonance apparatus wherein the employment of a local gradient coil unit has, among other things, a high degree of user friendliness associated therewith.

The above object is achieved in accordance with the principles of the present invention in a magnetic resonance apparatus having an examination space adapted to receive at least a region of an examination subject, and a gradient coil that is movable into the examination space in a travel direction, and a mount which allows the gradient coil unit to be fixed in at least one position in the magnetic resonance apparatus.

In an embodiment, the mount allows the gradient coil unit to be supported against a component which surrounds the examination space in order to fix the gradient coil in the aforementioned position in the magnetic resonance apparatus.

The mount can be actuated in order to fix the position of the gradient coil unit by the displacement of the gradient coil unit in the aforementioned travel direction.

In the inventive apparatus, a high degree of user friendliness combined with extremely short equipping times is achieved for making the gradient coil unit ready to use. Installation and removal of a whole-body antenna for making the gradient unit ready to use are completely eliminated.

In an embodiment, the magnetic resonance apparatus has a permanently installed gradient coil system and the mount is fashioned such that the movable gradient coil unit is supported against the gradient coil system for fixing. As a result, the forces emanating from the movable gradient coil unit are directly transmitted onto the permanently installed gradient coil system, which is better suited for absorbing such forces than, for example, is a whole-body antenna that would have to be additionally stiffened for this purpose. Further, the whole-body antenna is not stressed as a result of possible movements of the displaceable gradient coil unit.

In another embodiment, the magnetic resonance apparatus has a displaceable support mechanism that is displaceable on a guide mechanism of the magnetic resonance apparatus, and the displaceable gradient coil unit is fashioned to be displaceable on the same guide mechanism. In one version, the examination space has two opposite openings, so that the support mechanism can be displaced proceeding from one opening and the displaceable gradient coil unit can be displaced into the examination space proceeding from the other opening. This allows a time-efficient utilization of the magnetic resonance apparatus, with the examination subject, for example a patient, being placed on the support mechanism during the displacement of the gradient coil unit. After the patient has been positioned, the support mechanism together with the patient placed thereon is moved into the examination space wherein the gradient coil unit is already correctly positioned and fixed.

DESCRIPTION OF THE PREFERRED EMBODIMENTS

Figure 1:
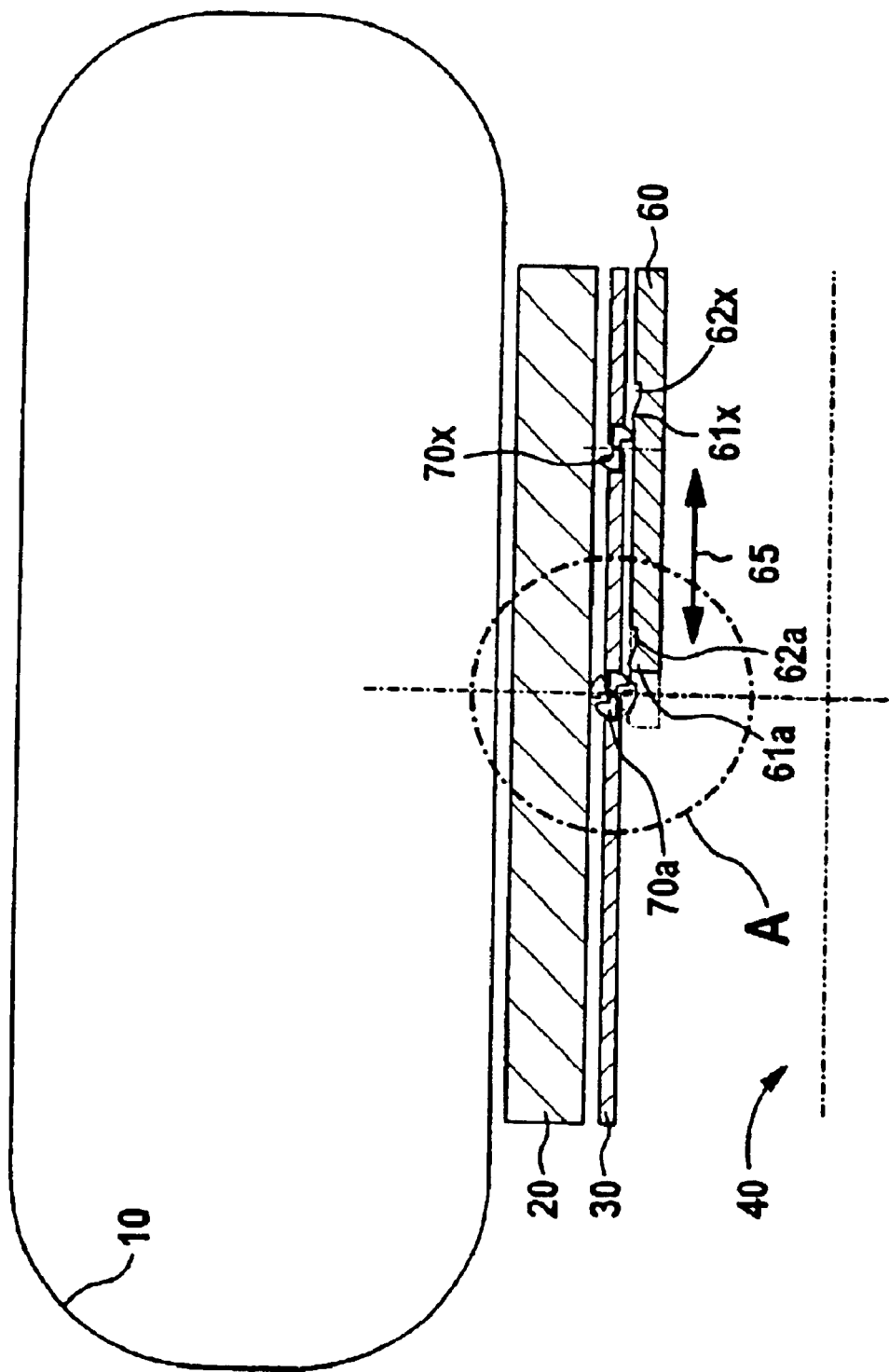
FIG. 1 is a longitudinal section through an upper half of a magnetic resonance apparatus with a displaceable gradient coil unit constructed in accordance with the principles of the present invention.

As an exemplary embodiment of the invention, FIG. 1 shows a longitudinal section through an upper half of a magnetic resonance apparatus having a displaceable gradient coil unit 60. The magnetic resonance apparatus has a scanner for obtaining MR data that includes an essentially hollow-cylindrical superconductive basic field magnetic 10 for generating a static basic magnetic field. A gradient coil system 20 that is likewise essentially hollow-cylindrical is permanently installed in the opening of the basic field magnet 10 for generating gradient fields. The permanently installed gradient coil system 20 thereby has three gradient coils, shielding coils belonging to the gradient coils, cooling devices and shim devices. An essentially hollow-cylindrical whole-body antenna 30 is also permanently installed in the opening of the gradient coil system 20 for emitting radio-frequency signals and for receiving magnetic resonance signals. A hollow interior of the whole-body antenna 30 essentially defines an examination space 40 for placing at least one region of an examination subject, for example of a patient, therein. The displaceable gradient coil unit 60 is displaceable into at least one part of the examination space 40. The gradient coil unit 60 has at least one, and up to three, gradient coils for generating gradient fields and, dependent on the requirements of use, these may be combined with shielding coils belonging to the gradient coils, cooling and shim devices and/or combined with a local radio-frequency antenna.

The whole-body antenna 30 is fashioned as carrier for a mount with which the movable gradient coil unit 60 can be fixed in at least one position in the radial direction. The mount includes at least six fixing devices 70a, 70b, 70c and 70x that are pivotable around respective rotational axes 78a and 75c arranged in the whole-body antenna 30. Three of the fixing devices 70a, 70b and 70c are arranged uniformly distributed around the circumference on a first circumferential line of the whole-body antenna 30 and the further three fixing devices 70x are arranged uniformly distributed around the circumference on a second circumferential line of the whole-body antenna 30.

The-fixing devices 70a, 70b, 70c and 70x and the movable gradient coil unit 60 are fashioned such that, given a displacement of the gradient coil unit 60 according to the displacement direction 65 indicated with the double arrow from the right into the examination space 40, the fixing devices 70a, 70b, 70c and 70x are automatically actuated by the displacement of the gradient coil unit 60, and simultaneously define a limit position (illustrated with broken lines) of the movable gradient coil unit 60. To this end, the gradient coil unit 60 has nose-like projections 61a and 61x in combination with recesses 62a and 62x on its outside at locations that are arranged in conformity with the arrangement of the fixing devices 70a, 70b, 70c and 70x. So that the gradient coil unit 60 when completely retracted from the examination space 40 can be properly introduced into the examination space 40 up to the limit position proceeding from the right, the projections 61a and recesses 62a arranged at the left side of the gradient coil unit 60 are fashioned closer to the midpoint than the projections 61x and recesses 62x arranged in the region of the middle of the gradient coil unit 60. As a result, the fixing devices 70x are not immediately, actuated by the projections 61a and recesses 62a upon introduction from the right; rather, they can be moved past these profiles. This, of course, also assumes a suitable arrangement and fashioning of the fixing devices 70a, 70b, 70c and 70x.

Figure 2:
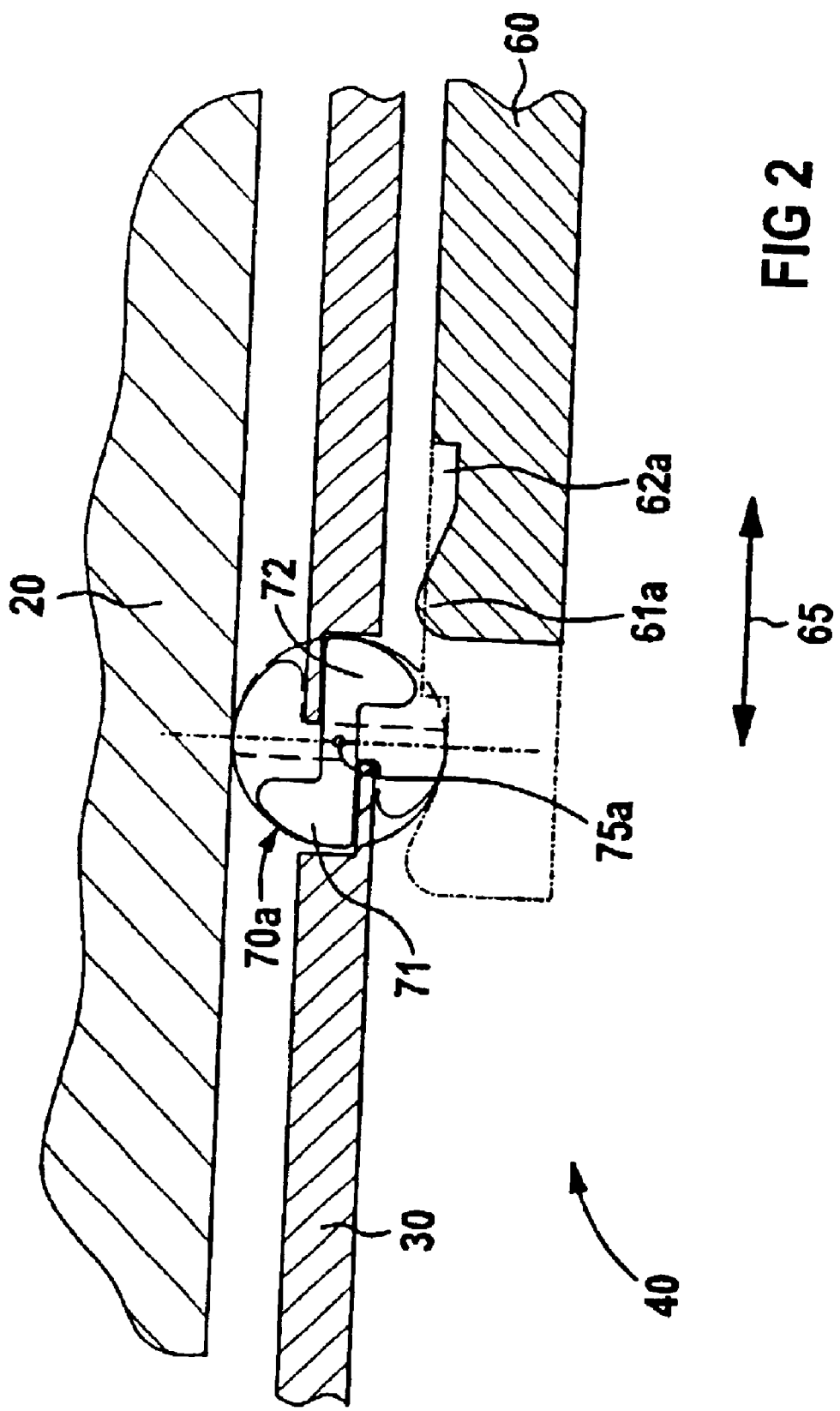
FIG. 2 is an excerpt of FIG. 1 shown enlarged.

A more detailed description of the structure of one of the fixing devices 70a, 70b, 70c and 70x and the action thereof in interaction with the movable gradient coil unit 60 ensues with reference to FIG. 2, which shows an enlarged illustration of the excerpt referenced A in FIG. 1. The fixing device 70a is seated to be pivotable around a rotational axis 75a in the whole-body antenna 30. The fixing device 70a has a symmetrical shape with respect to the rotational axis 75a, with a first cam 71 and a second cam 72. The first cam 71 exhibits greater weight than the second cam 72, for example by being fashioned of a material with high density, so that the position of the fixing device 70a shown with solid lines automatically occurs when the gradient coil unit 60 is not introduced or not completely introduced. Given an introduction of the movable gradient coil unit 60 from the right into the examination space 40, the elevation 61a of the gradient coil unit 60 entrains the second cam 72 and causes the fixing device 70a to execute a rotary motion around its rotational axis 75a until the first cam 71—in the position indicated with broken lines—presses against the permanently installed gradient coil system 20. The movable gradient coil unit 60 has thus been locked in the radial direction relative to the permanently installed gradient system 20.

The permanently installed gradient coil system 20 is resin cast as a hollow cylinder having a high wall thickness and its fastening in the basic field magnet 10 is well-suited for absorbing the pressure stresses due to the fixing devices 70a, 70b, 70c and 70x. For a removal of the movable gradient coil unit 60 from the examination space 40, the gradient coil unit 60 is moved in the travel direction 65 toward the right. The displacement to the gradient coil unit 60 can ensue manually as well as with the assistance of a motorized drive. The electrical leads and, if used, cooling supply conduits needed for a supply of the gradient coil unit 60 are supplied to the gradient coil unit 60 from the right.

Figure 3:
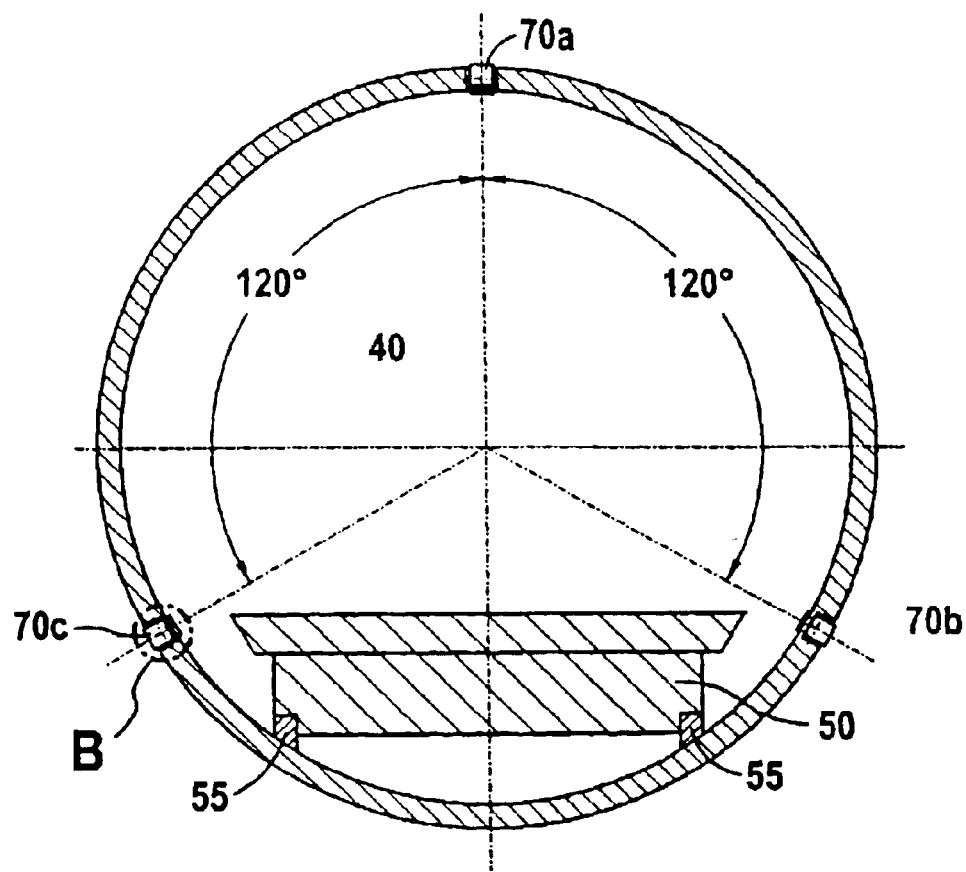
FIG. 3 is a cross-section through the whole-body antenna shown in FIG. 1 including a displaceable bearing mechanism.

FIG. 3 shows a cross-section through the whole-body antenna 30 of FIG. 1 in the region of the fixing devices 70a, 70b and 70c including a movable support device 50. In FIG. 3, the equal distribution of the three fixing devices 70a, 70b and 70c around the circumference that has already been described in FIG. 1 is illustrated with 120° arc arrows. The movable support mechanism 50 makes it possible to introduce the examination subject placed on the support mechanism 50, for example the patient, from the left into the examination space 40 with respect to the longitudinal section shown in FIG. 1. The support mechanism 50 is seated to be displaceable on a guide system 55. In one embodiment, the movable gradient coil unit 60 is also fashioned to be displaceable on the same guide system 55, which is unproblematical particularly given a weight of the gradient coil unit 60 that is somewhat lower than the allowed loading weight of the support mechanism 50. Special measures need to be provided only given a weight of the gradient coil unit 60 that is greater then approximately 200 kg.

Figure 4:
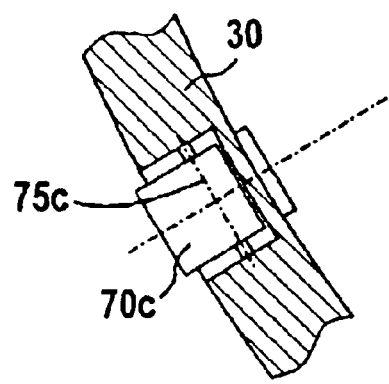
FIG. 4 is an excerpt from FIG. 3 shown enlarged.

In an enlarged view, FIG. 4 shows the excerpt referenced B in FIG. 3. FIG. 4 again illustrates the fashioning and arrangement of the fixing device 70c to be pivotably seated around the rotational axis 75c in the whole-body antenna 30.

Finally, existing magnetic resonance apparatus can also be retrofitted in a simple and economic way to form a magnetic resonance apparatus with a movable gradient coil unit 60 corresponding to FIG. 1. To this end, a whole-body antenna of the existing magnetic resonance apparatus merely has to be replaced by an above-described whole-body antenna 30 with fixing devices 70a, 70b, 70c and 70x and the movable gradient coil unit 60 merely has to be added.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance apparatus comprising:
    a scanner for obtaining magnetic resonance data, and having a component which surrounds an examination space adapted to receive at least a portion of an examination subject, said examination space having a longitudinal axis;
    a removable gradient coil unit longitudinally movable into and out of said examination space in a travel direction substantially parallel to said longitudinal axis; and
    a mount projecting into said examination space from said component for supporting said gradient coil against said component to releasably fix said gradient coil to said scanner in at least one position in said scanner.

2. A magnetic resonance apparatus as claimed in claim 1 wherein said component allows said gradient coil to be supported adjacently against said component.

3. A magnetic resonance apparatus as claimed in claim 1 wherein said component comprises a permanently installed gradient coil system of said magnetic scanner.

4. A magnetic resonance apparatus as claimed in claim 1 further comprising a whole body antenna disposed between said examination space and said component, said antenna allowing said mount to support said gradient coil system through said antenna.

5. A magnetic resonance apparatus as claimed in claim 4 wherein said whole body antenna has at least one opening allowing said gradient coil unit to be supported through said opening against said component.

6. A magnetic resonance apparatus as claimed in claim 4 wherein said whole body antenna forms a carrier for said mount.

7. A magnetic resonance apparatus as claimed in claim 1 wherein said mount is actuated by displacement of said gradient coil unit in said travel direction to fix said gradient coil unit in said at least one position.

8. A magnetic resonance apparatus as claimed in claim 1 wherein said mount and said gradient coil unit interact with each other to limit an amount of displacement of said gradient coil unit in said travel direction into said examination space.

9. A magnetic resonance apparatus as claimed in claim 1 wherein said mount comprises at least one fixing mechanism pivotable around a rotational axis.

10. A magnetic resonance apparatus as claimed in claim 9 wherein said fixing mechanism is symmetrical relative to said rotational axis.

11. A magnetic resonance apparatus as claimed in claim 10 wherein said fixing mechanism comprises two cams respectively disposed at opposite sides of said rotational axis.

12. A magnetic resonance apparatus as claimed in claim 11 wherein one of said cams has a higher weight than the other of said cams.

13. A magnetic resonance apparatus as claimed in claim 9 comprising three fixing mechanism equidistantly disposed around said circumference of said examination space.

14. A magnetic resonance apparatus as claimed in claim 1 further comprising a movable support mechanism adapted to receive said patient thereon arid a guide mechanism for moving said support mechanism relative to said examination space, said gradient coil unit being longitudinally movable in said travel direction by said guidance mechanism.

15. A magnetic resonance apparatus as claimed in claim 1 wherein said scanner has two openings disposed opposite each other with said examination space being disposed between said two openings, and wherein said magnetic resonance apparatus further comprises a movable support mechanism adapted to receive said patient thereon which is movable into said examination space from one of said openings, and wherein said gradient coil unit is longitudinally movable into said examination space in said travel direction proceeding from the other of said openings.

16. A magnetic resonance apparatus as claimed in claim 1 wherein said gradient coil unit comprises at least one nose-like projection disposed adjacent to a recess in said gradient coil unit, for interacting with said mount as said gradient coil unit is displaced in said travel direction to actuate said mount to releasably fix said gradient coil unit in said at least one position.

17. A magnetic resonance apparatus comprising:
    a magnetic resonance scanner containing an examination space adapted to receive at least a region of an examination subject therein, said examination space having a longitudinal axis;
    a removable gradient coil unit longitudinally movable into said examination space in a travel direction substantially parallel to said longitudinal axis;
    a mount disposed in said examination space for releasably fixing said gradient coil unit in at least one position in said magnetic resonance scanner; and
    said mount and said gradient coil unit interacting with each other to actuate said mount, as said gradient coil unit is displaced in said traveling direction, to releasably fix said gradient coil unit to said scanner in said at least one position in said scanner.

18. A magnetic resonance apparatus as claimed in claim 17 further comprising a whole body antenna, said whole body antenna forming a carrier for said mount.

19. A magnetic resonance apparatus as claimed in claim 17 wherein said magnetic resonance scanner includes a permanently installed gradient coil system, and wherein said mount supports said gradient coil unit against said gradient coil system when said gradient coil unit is fixed in said at least one position.

20. A magnetic resonance apparatus as claimed in claim 17 wherein said mount and said gradient coil unit interact with each other to limit an amount of displacement of said gradient coil unit in said :navel direction into said examination space.

21. A magnetic resonance apparatus as claimed in claim 17 mount comprises at least one fixing mechanism pivotable around a rotational axis.

22. A magnetic resonance apparatus as claimed in claim 21 comprising three fixing mechanism equidistantly disposed around said circumference of said examination space.

23. A magnetic resonance apparatus as claimed in claim 17 fixing mechanism is symmetrical relative to said rotational axis.

24. A magnetic resonance apparatus as claimed in claim 23 wherein said fixing mechanism comprises two cams respectively disposed at opposite sides of said rotational axis.

25. A magnetic resonance apparatus as claimed in claim 24 of said cams has a higher weight than the other of said cams.

26. A magnetic resonance apparatus as claimed in claim 17 further comprising a movable support mechanism adapted to receive said patient thereon and a guide mechanism for moving said support mechanism relative to said examination space, said gradient coil unit being longitudinally movable in said travel direction by said guidance mechanism.

27. A magnetic resonance apparatus as claimed in claim 17 wherein said scanner has two openings disposed opposite each other with said examination space being disposed between said two openings, and wherein said magnetic resonance apparatus further comprises a movable support mechanism adapted to receive sad patient thereon which is longitudinally movable into said examination space from one of said openings, and wherein said gradient coil unit is movable into said examination space in said travel direction proceeding from the other of said openings.

28. A magnetic resonance apparatus as claimed in claim 17 wherein said gradient coil unit comprises at least one nose-like projection disposed adjacent to a recess in said gradient coil unit, for interacting with said mount as said gradient coil unit is displaced in said travel direction lo actuate said mount to releasably fix said gradient coil unit in said at least one position.

* * * * *